(12) United States Patent
Novak et al.

(10) Patent No.: US 11,392,449 B2
(45) Date of Patent: Jul. 19, 2022

(54) ANTI-TEARING PROTECTION SYSTEM FOR NON-VOLATILE MEMORIES

(71) Applicant: EM MICROELECTRONIC MARIN S.A., Marin (CH)

(72) Inventors: Tomas Novak, Libeznice (CZ); Filippo Marinelli, Lussy-sur-Morges (CH)

(73) Assignee: EM MICROELECTRONIC-MARIN S.A., Marin (CH)

( * ) Notice: Subject to any disclaimer, the term of this patent is extended or adjusted under 35 U.S.C. 154(b) by 111 days.

(21) Appl. No.: 16/655,988

(22) Filed: Oct. 17, 2019

(65) Prior Publication Data
US 2020/0133765 A1   Apr. 30, 2020

(30) Foreign Application Priority Data

Oct. 31, 2018   (EP) .................................... 18203819

(51) Int. Cl.
*G06F 11/10*   (2006.01)
*G06F 3/06*   (2006.01)

(52) U.S. Cl.
CPC ........ *G06F 11/1004* (2013.01); *G06F 3/0619* (2013.01); *G06F 3/0659* (2013.01); *G06F 3/0679* (2013.01)

(58) Field of Classification Search
CPC .. G06F 11/1004; G06F 3/0619; G06F 3/0659; G06F 3/0679; G06F 11/141;
(Continued)

(56) References Cited

U.S. PATENT DOCUMENTS

2008/0301357 A1   12/2008   La Rosa et al.
2010/0306604 A1   12/2010   McGinty et al.
(Continued)

FOREIGN PATENT DOCUMENTS

JP   2011034125 A   2/2011
JP   2018163720 A   10/2018
(Continued)

OTHER PUBLICATIONS

European Search Report of European Application No. 18203819.0 dated Apr. 15, 2019.
(Continued)

*Primary Examiner* — James C Kerveros
(74) *Attorney, Agent, or Firm* — Sughrue Mion, PLLC

(57) ABSTRACT

The present invention concerns an anti-tearing protection system (1) for a non-volatile memory (3) comprising a first memory block (5) and a second memory block (7), the first and second memory blocks (5, 7) being arranged to store a data set comprising user data and an error detection code obtained based on the user data. The first and second memory blocks (5, 7) can be read in a first read mode for determining logic states of data elements comprised in the data set according to the first read mode. The user data in a respective memory block are considered to be correct according to the first read mode if its error detection code equals a first given value. The first and second memory blocks (5, 7) can further be read in a second read mode for determining the logic states of the data elements comprised in data set according to the second read mode. The user data in a respective memory block are considered to be correct according to the second read mode if its error detection code equals the first given value and if the user data as read in the second read mode are determined to be identical to the user data as read in the first read mode. A third read mode may also be defined. The first read mode may be considered to be a normal read mode, while the second and third read modes may be used to determine if data were strongly written and erased, respectively.

16 Claims, 1 Drawing Sheet

(58) Field of Classification Search
CPC .. G06F 11/1068; G06F 11/1048; G11C 16/26; G11C 11/1673; G11C 13/004; G11C 29/42
USPC .......................................................... 714/799
See application file for complete search history.

(56) References Cited

U.S. PATENT DOCUMENTS

| | | | |
|---|---|---|---|
| 2014/0173180 A1 | 6/2014 | D'Abreu et al. | |
| 2016/0147600 A1 | 5/2016 | Gao et al. | |
| 2017/0287564 A1* | 10/2017 | Park .................... | G11C 29/028 |
| 2017/0309343 A1 | 10/2017 | Lim | |
| 2018/0341543 A1* | 11/2018 | Ha .................... | H03M 13/3707 |
| 2019/0095280 A1* | 3/2019 | Bhatia .................... | G11C 29/52 |

FOREIGN PATENT DOCUMENTS

| | | |
|---|---|---|
| KR | 1020150096646 A | 8/2015 |
| KR | 1020160030978 A | 3/2016 |
| KR | 1020170120741 A | 11/2017 |

OTHER PUBLICATIONS

Communication dated Nov. 24, 2020, from the Japanese Patent Office in application No. 2019193212.
Communication dated Dec. 15, 2020, from the Korean Intellectual Property Office in application No. 10-2019-0132329.

* cited by examiner

ANTI-TEARING PROTECTION SYSTEM FOR NON-VOLATILE MEMORIES

This application claims the benefit of priority of European Patent Application No. 18203819.0 of Oct. 31, 2018, the entire contents of which are incorporated herein by reference.

TECHNICAL FIELD

The present invention relates to an anti-tearing protection system for non-volatile memories (NVMs) for integrated circuit (IC) cards for instance. More specifically, the proposed system is especially suitable for timing constrained systems where a memory block update has to be carried out in a very short time. The invention also relates to a method of operating the proposed anti-tearing system.

BACKGROUND OF THE INVENTION

In systems where power supply can be easily interrupted, for example by tearing an IC card, such as a radio-frequency identification (RFID) card, from a card reader, it can occur that a write operation is interrupted in the middle of a write operation and the data written inside IC are corrupted. If there is no other system to back up the data, it is often necessary to implement an anti-tearing protection system inside the IC. Such a system shall ensure that in the case of a power tearing event during a write operation, the system either keeps old data or new data are correctly written.

State-of-art anti-tearing systems in smart cards or other IC cards are based on several principles as explained next. One common system is a two-location system with a flag. According to this solution, the IC writes data in one of the two different locations and the system uses a separate flag to indicate which data are valid, i.e. where an update of data occurred the last time correctly. During a new write operation, the IC chooses the location with invalid data (keeping the location with valid data) and it updates that location. When this operation is finished, the system updates the flag to point to the location, which was just updated. In the case of a tearing during a data update, the old data are unchanged and flag points to them. In the case of a tearing during a flag update, it can happen that the flag is corrupted, and it would either point to the new or the old data. But the write operation of the new data was correctly finished before updating the flag. This ensures that the data are correct and not corrupted. However, the disadvantage of this system is that it needs at least two independent write operations: one for the data and one for the flag. In many time constraint systems, this kind of solution is however not feasible in practice.

Another example of a known anti-tearing system is an N word rolling buffer with error detection code (EDC). The data are stored in N locations (N being a positive integer), and every location includes an order number (Nb) and an EDC. The EDC is calculated from stored data and the error correction check shall pass if the data are correct and fail if the data do not correspond to the EDC. When data are updated, new data are written with Nb+1 and the error detection scheme is run based on the new data. During a start-up, the IC checks all locations and the correctness of the data by using the EDC. It takes as valid data the data with a valid EDC and the highest Nb. The disadvantage of this system is that if N=2, and if two consecutive tearing events occur, then the data are lost. To increase the robustness of the system, N should be significantly higher, which would take memory space, i.e. chip area. In any case, this kind of system is only robust to N−1 tearing events.

Yet another example of a known anti-tearing system is a system with an error correction code (ECC) and a restoring function. In this system, the IC writes a data error correction code. The ECC verifies if the written data are consistent and it also allows to correct them. When a write operation is interrupted, then during a next power-up, the IC verifies the integrity of the data. If it is detected that the data are not correct, i.e. the ECC scheme fails, the system restores the correct state based on the ECC and it corrects the memory state using a write operation during the start-up. This system has the disadvantage that if another tearing event occurs during a restore phase, the data are completely lost. Furthermore, the ECC can correct only a limited number of error bits. If more bits are changed, the system fails.

SUMMARY OF THE INVENTION

An object of the present invention is to overcome at least some of the above shortcomings of the existing anti-tearing systems. More specifically, the present invention aims to provide an anti-tearing system for NVMs, which is particularly suited for systems having strict timing constraints.

According to a first aspect of the invention, there is provided an anti-tearing protection system for a non-volatile memory as recited in claim 1.

The proposed solution has the advantage that in the proposed system only one write operation is needed to update a memory block. For example, there is no need to update any flag. Consequently, the proposed system is convenient for systems which are timing critical and there is time for only one write operation. The proposed system is also robust against indefinite number of tearing attempts because it enables to keep the valid memory value intact. Furthermore, the present system is area efficient because it needs only two memory blocks.

According to a second aspect of the invention, there is provided an integrated circuit card comprising the anti-tearing protection system.

According to a third aspect of the invention, there is provided a method of operating the anti-tearing system.

Other aspects of the invention are recited in the dependent claims attached hereto.

BRIEF DESCRIPTION OF THE DRAWINGS

Other features and advantages of the invention will become apparent from the following description of a non-limiting example embodiment, with reference to the appended drawings, in which.

DETAILED DESCRIPTION OF THE INVENTION

Figure 1:
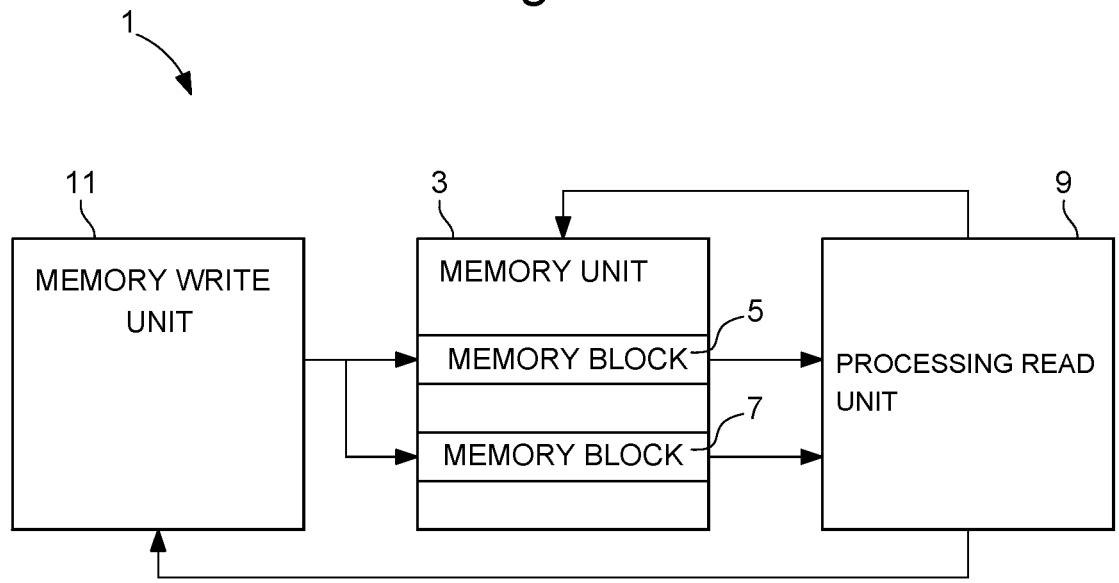
FIG. 1 shows a simplified block diagram illustrating a tearing system according to an example embodiment of the present invention.

An embodiment of the present invention will now be described in detail with reference to the attached figures. The invention will be described in the context of an anti-tearing system of an RF smart card, such as an RFID IC card. However, the teachings of the invention are not limited to this environment or application. Identical or corresponding functional and structural elements which appear in different drawings are assigned the same reference numerals. As utilised herein, "and/or" means any one or more of the items in the list joined by "and/or". As an example, "x and/or y" means any element of the three-element set {(x), (y), (x,y)}. In other words, "x and/or y" means "one or both of x and y." As another example, "x, y, and/or z" means any element of the seven-element set {(x), (y), (z), (x,y), (x,z), (y,z), (x,y, z)}. In other words, "x, y and/or z" means "one or more of x, y, and z." Furthermore, the term "comprise" is used herein as an open-ended term. This means that the object encompasses all the elements listed, but may also include additional, unnamed elements. Thus, the word "comprise" is interpreted by the broader meaning "include", "contain" or "comprehend".

The proposed anti-tearing system is designed for instance for NVM systems which have the following limitations:
1) The used protocol and NVM timing scheme allow only one update operation during an update of critical data. For example, the system cannot use a separate flag;
2) The memory area restrictions allow only two memory locations. These restrictions do not allow using N word rolling buffer; and
3) The robustness is currently limited to a single tearing event.

As explained next in more detail, the present invention proposes a new solution, which verifies the robustness of a last memory write operation. FIG. 1 illustrates schematically some elements of the proposed anti-tearing system 1, which may be useful for understanding the teachings of the present invention. FIG. 1 shows an NVM unit or element 3, or simply a memory unit, which can verify the robustness of written data, i.e. how strongly or weakly the data was written. The memory unit 3 comprises a first memory block or buffer 5 and a second memory block or buffer 7, which in this example are independent memory blocks and have their own memory address or location. These memory blocks are non-volatile memories, which are types of memory that can retrieve stored data or information even after the system power has been shutted down. Examples of NVMs include read-only memory, flash memory, EEPROM memory, ferroelectric random-access memory (FRAM), magnetic random-access memory (MRAM), resistive random-access memory (RRAM), many types of magnetic computer storage devices (including e.g. hard disk drives, solid state drives, floppy disks, and magnetic tapes) and optical discs.

In FIG. 1, there is also shown a processing unit 9 configured to read both the first and second memory blocks 5, 7. The memory blocks can advantageously be read using different memory read modes such that it is possible to distinguish which data are correct and thus valid and which are corrupted. Together with a memory write unit 11, the processing unit ensures that valid data are always kept. The memory write unit 11 comprises a system which is arranged to be used during a write operation to selectively store data in the two independent memory blocks 5, 7 (or memory locations). In the present example, each memory block comprises the following data:
user data;
a counter, also referred to as an anti-tearing (AT) counter, to indicate which word was written last or which memory block was updated last; and
an EDC calculated over a given data set, which in this example comprises the user data and the counter. In other words, in this example, the EDC is calculated over the user data and the counter.

Figure 2:
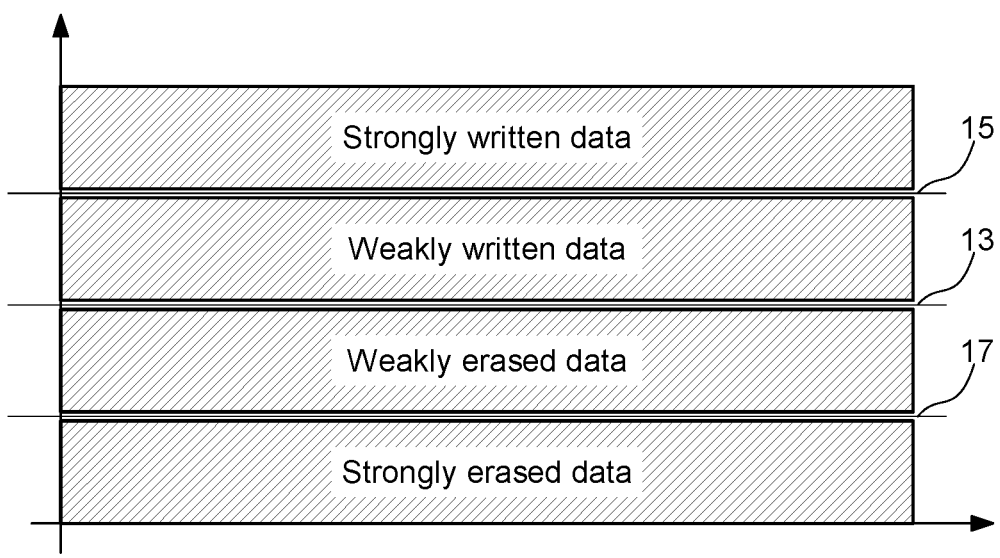
FIG. 2 is a diagram showing some memory read levels that may be used in the anti-tearing system of FIG. 1.

In the present example, the robustness of the data in the memory blocks 5, 7 is arranged to be checked or verified using three different or independent memory read modes or operations, namely a first read mode, referred to as a normal read (NR) mode, a second read mode, referred to as a write margin read (WMR) mode, and a third read mode, referred to as an erase margin read (EMR) mode. The relationship of these modes is illustrated in FIG. 2, where according to this example, the vertical axis or the y-axis represents the charge level (or alternatively a voltage level) of a given memory cell used for storing one data element, i.e. a bit. However, the read modes may instead be defined using other parameters than the charge level or value.

As is explained next, the different read modes are used to determine how strongly or weakly data are written or erased in the memory. The NR mode may be considered to be the default read mode. The NR mode defines a first rule set for determining the logic states or levels of the data bits according to the NR mode. In this example, the first rule set comprises a first threshold 13 referred to as a normal read level 13. As shown in FIG. 2, the normal read level 13 corresponds to (approximately) a half of the maximum possible charge level Cmax of a respective memory cell. Thus, the normal read level in this example equals substantially to Cmax/2. More broadly, the normal read level 13 may be between 40% to 60% of the maximum charge level (assuming charge levels are used). Thus, a bit derived from a memory cell charge value, which equals to or is above the normal read level 13 is determined to have a first logic state, which in this example corresponds to a bit value 1, whereas a bit derived from a memory cell charge value, which is below the normal read level 13 is determined to have a second logic state, i.e. a bit value 0 in this example. It is to be noted a charge value of a given memory cell may change over time. Consequently, a charge value of a memory cell, which is initially just above the normal read level 13, may over time drop below the normal read level. This would mean that the bit corresponding to that memory cell would also change its value from one state to another, i.e. in this example from 1 to 0.

The WMR mode defines a second rule set for determining the logic states of the data bits according to the WMR mode. In this example, the second rule set comprises a second threshold 15 referred to as a write margin read level 15. As is shown in FIG. 2, the write margin read level 15 is set to be above the normal read level 13. In this specific example, the charge level of the write margin read level is approximately three quarters of the maximum possible charge level. In other words, the write margin real level 15 equals substantially (¾)·Cmax. More broadly, the write margin real level 15 may be between 65% and 85% of Cmax. The write margin read level is used to determine if previously erased cells are written in a robust manner. Thus, according to the WMR mode, a bit derived from a memory cell charge value, which equals to or is above the write margin read level 15 is determined to have the first logic state, which in this example corresponds to the bit value 1, whereas a bit derived from a memory cell charge value, which is below the write margin read level is determined to have the second logic state, i.e. the bit value 0 in this example. Thus, any logic states having the value 1 (in this example) as determined in the WMR mode, can be considered to be written strongly and it is thus unlikely that during a given retention time, a strongly written bit would change its charge level to be below the NR level and thus change its value read in the NR mode.

The EMR mode defines a third rule set for determining the logic states of the data bits according to the EMR mode. In this example, the third rule set comprises a third threshold 17 referred to as an erase margin read level 17. As is further shown in FIG. 2, the erase margin read level 17 is set to be below the normal read level 13. In this specific example, the charge level of the erase margin read level is approximately one quarter of the maximum possible charge level. In other words, the erase margin read level 17 equals substantially (¼)·Cmax. More broadly, the erase margin real level may be between 15% and 35% of Cmax. The erase margin read level 17 is used to determine if erased cells are erased in a robust manner. Thus, according to the EMR mode, a bit derived from a memory cell charge value, which equals to or is above the erase margin read level 17 is determined to have the first logic state, which in this example corresponds to the bit value 1, whereas a bit derived from a memory cell charge value, which is below the erase margin read level 17 is determined to have the second logic state, i.e. the bit value 0 in this example. Thus, any logic states having the value 0 (in this example) as determined in the EMR mode, can be considered to be erased strongly and it is thus unlikely that during a given retention time, a strongly erased bit would change its charge level to be above the NR level and thus change its value read in the NR mode.

The three thresholds, namely the normal read level 13, the write margin read level 15 and the erase margin read level 17 define four data strengthness zones as shown in FIG. 2. The zone above the write margin read level 15 is a strongly written data zone, the zone between the write margin read level 15 and the normal read level 13 is a weakly written data zone, the zone between the normal read level 13 and the erase margin read level 17 is a weakly erased data zone and the zone below the erase margin read level 17 is a strongly erased data zone.

In view of the above, if data are read correctly with the EMR mode and/or WMR mode, it is ensured that normal read data are read correctly and that they will stay correct during a specified retention time. Furthermore, if data are read correctly with the NR mode but not with the EMR mode, then the data were weakly erased, while if data are read correctly with the NR mode but not with the WMR mode, then it can be determined that the data were weakly written.

The proposed algorithm works correctly as an anti-tearing protection even if only the NR mode and one of the other two read modes are used. The only limitation of using only two read modes relates to the end-of-life of an NVM. At this moment, the data corruption may additionally be due to the fact that a memory is worn out and data can thus change randomly even if written correctly. In such a case the risk may simply be accepted because it is an end-of-life of product or a counter may be added to limit the number of write cycles to the memory. However, it is to be noted that the teachings of the present invention equally apply if one or more further read modes defining their own rules sets are added.

Data correctness rules are next explained. In the present embodiment it is defined that data in a memory block read using the normal read mode are considered as correct if
1. the EDC is correct, i.e. it is equal to f(AT, user data), which was stored in the respective memory when it was last updated; and the AT counter has a valid value.

It is further defined that data in a memory block read using the erase margin read mode or the write margin read mode are considered as correct if
1. the EDC is correct, i.e. it is equal to f(AT, user data);
2. the AT counter has a valid value; and
3. the data read in this mode are equivalent to the data read using the normal read.

In this case, since there are two memory blocks, the AT counter consists of two bits defining four possible values. One of the values could thus indicate an invalid state, while the remaining three values would indicate a valid state. However, other implementations for the counter are also possible.

The anti-tearing algorithm rules are defined next to determine which memory block is valid. For the purpose of the anti-tearing algorithm, margin read (MR) is defined as follows:
In implementations with both EMR and WMR modes, the MR=EMR AND WMR;
In implementations with only WMR, the MR=WMR; and
In implementations with only EMR, the MR=EMR.

For the simplicity of the description of the below rules, it is further defined:
Block X can be Block 1 or Block 2; and
Block Y is then the other one of the blocks.

In other words, if Block X is Block 1, then Block Y is Block 2, and if Block X is Block 2, then Block Y is Block 1.

The proposed algorithm has the following rules:
1. Block X NR is correct AND Block 1 MR is correct AND Block Y NR is correct AND Block 2 MR is correct, then the valid block is the one whose AT counter indicates to be newer i.e. the block which was last updated. In this scenario, no tearing occurred.
2. Block X NR is correct AND Block X MR is correct AND Block Y NR is correct AND Block Y MR is NOT correct, then Block X is valid. In this scenario, it can be determined that Block Y was torn during the memory update operation.
3. Block X NR is correct AND Block Y NR is NOT correct, then Block X is valid. In this scenario, Block Y can be determined to be corrupted without using the MR mode.
4. Block X NR is correct AND Block X MR is NOT correct AND Block Y NR is correct AND Block Y MR is NOT correct, then the valid block is the one with the AT counter indicating to be older. In this situation it cannot be said exactly which block is strongly and weakly written. But thanks to the proposed system, we know that the older block had the MR correct at least once in the past because we started to update the newer block. But we cannot say it for the newer one because this is the first time it is being checked. Thus, the margin level of the older one is higher, close to MR and it was only deteriorated over time.
5. Block X NR is NOT correct AND Block Y NR is NOT correct, then it can be determined that the memory blocks are at their end-of-life. In this case no NVM action is taken, and the end-of-life is reported to another system. It may further be prevented from writing into these memories.

Once the valid memory block has been determined as explained above, the processing unit 9 may now inform the memory write unit 11 about the determination outcome. Thus, the memory write unit 11 may now update the invalid memory block with new information or data based on the feedback from the processing unit 9. Thus, the memory updating rules are the following:
1. A valid block is kept and not modified; and
2. An invalid block is updated with a new value or new set of values.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims. For example, it would be possible to add one or more further memory blocks to the proposed system.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. An anti-tearing protection system of a non-volatile memory unit comprising:
   a first memory block; and
   a second memory block,
   wherein the first and second memory blocks are configured to store a data set comprising user data and an error detection code obtained based on the user data,
   wherein the first and second memory blocks are configured to be read, using a processing unit configured to read the first and second memory blocks, in a first read mode defining a first rule set for determining logic states of data elements comprised in the data set according to the first read mode,
   wherein said first rule set comprises a first memory read threshold,
   wherein the first and second memory blocks are further configured to be read, using the processing unit configured to read the first and second memory blocks, in a second read mode defining a second rule set for determining the logic states of the data elements comprised in the data set according to the second read mode,
   wherein said second rule set comprises a second memory read threshold,
   wherein the data set further comprises a counter value indicating which of the first memory block and the second memory block was updated last,
   wherein the error detection code indicates setting the counter value based on determining whether a charge of at least one of the first memory block and the second memory block is within both a first predetermined percentage range, according to the first memory read threshold, of a maximum charge value and a second predetermined percentage range, according to the second memory read threshold, of the maximum charge value of the at least one of the first memory block and the second memory block, and
   wherein the error detection code is further obtained based on the counter value.

2. The anti-tearing protection system according to claim 1, wherein if a given property linked to a data element equals to or is above the first read threshold, then the data element has a first logic state according to the first read mode, while if the given property is below the first read threshold, then the data element has a second, different logic state according to the first read mode, and wherein if the given property is equals to or is above the second read threshold, then the data element has a first logic state according to the second read mode, while if the given property is below the second read threshold, then the data element has the second logic state according to the second read mode.

3. The anti-tearing protection system according to claim 2, wherein the given property is derivable from a memory cell level.

4. The anti-tearing protection system according to claim 1, wherein the first and second memory blocks are further arranged to be read in a third read mode defining a third rule set, different from the first and second rule sets, for determining logic states of the data elements comprised in the data set according to the third read mode, and wherein the user data in the respective memory block are considered to be correct according to the third read mode if an error detection code of the third read mode equals the first given value and if the user data as read in the third read mode are determined to be identical to the user data as read in the first read mode.

5. The anti-tearing protection system according to claim 1, wherein the first given value equals the error detection code stored in the respective memory block during a previous memory write operation.

6. The anti-tearing protection system according to claim 1, wherein a further condition for the user data correctness according to the first and second read modes is that the counter value have a given counter value.

7. An integrated circuit card comprising the anti-tearing protection system according to claim 1.

8. A method of operating the anti-tearing protection system according to claim 1, wherein if:
   the data set in the first memory block is determined to be correct according to the first read mode, and the data set in the first memory block is determined to be correct according to the second read mode; and
   the data set in the second memory block determined to be correct according to the first read mode, and the data set in the second memory block is determined to be correct according to the second read mode,
   then, in a case wherein the data set further comprises a counter value indicating which memory block was updated last and wherein the error detection code is further obtained based on the counter value, determining that a valid memory block is the one which was last updated, and updating the first updated memory block with another set of data.

9. A method of operating the anti-tearing protection system according to claim 1, wherein if:
   the data set in the first memory block is determined to be correct according to the first read mode, and the data set in the first memory block is determined to be correct according to the second read mode; and
   the data set in the second memory block is determined to be correct according to the first read mode, and the data set in the second memory block is determined to be incorrect according to the second read mode,
   then determining that the first memory block is valid, and updating the second memory block with another set of data.

10. A method of operating the anti-tearing protection system according to claim 1, wherein if:
    the data set in the first memory block is determined to be correct according to the first read mode; and
    the data set in the second memory block is determined to be incorrect according to the first read mode,
    then determining that the first memory block is valid, and updating the second memory block with another set of data.

11. A method of operating the anti-tearing protection system according to claim 1, wherein if:

the data set in the first memory block is determined to be correct according to the first read mode, and the data set in the first memory block is determined to be incorrect according to the second read mode; and the data set in the second memory block is determined to be correct according to the first read mode, and the data set in the second memory block is determined to be incorrect according to the second read mode, then wherein the data set further comprises a counter value indicating which memory block was updated last, and wherein the error detection code is further obtained based on the counter value, determining that a valid memory block is the one which was first updated, and updating the last updated memory block with another set of data.

12. A method of operating the anti-tearing protection system according to claim 1, wherein if:

the data set in the first memory block is determined to be incorrect according to the first read mode; and the data set in the second memory block is determined to be incorrect according to the first read mode, then determining that the first and second memory blocks are invalid.

13. A method according to claim 12, wherein the method further comprises preventing a further write operation to the first and second memory blocks.

14. The anti-tearing protection system according to claim 1, wherein the second read mode comprises a first one of a write margin read (WMR) mode and an erase margin read (EMR) mode, wherein the first and second memory blocks are further configured to be read in a third read mode comprising another one of the WMR mode and the EMR mode different than the first one of the WMR mode and the EMR more of the second read mode, and wherein at least one of the second read mode and the third read mode is configured to determine whether the user data is identical among each of the first read mode, the second read mode, and the third read mode.

15. The anti-tearing protection system according to claim 14, wherein the WMR mode comprises determining whether the charge is greater than the second memory read threshold, and wherein the EMR mode comprises determining whether the charge is lesser than the first memory read threshold.

16. The anti-tearing protection system according to claim 1, wherein the counter value consists of two bits, wherein the error detection code further indicates setting the two bits of the counter value to:

a first value based on determining that the charge is within both the first predetermined percentage range and also the second predetermined percentage range, a second value based on determining that the charge is within the first predetermined percentage range and is outside of the second predetermined percentage range, and wherein the error detection code further indicates that each of the first value and the second value indicate that the user data is written to at least one of the first and second memory blocks and also that the first value indicates that the user data is more strongly written to at least one of the first and second memory blocks than is indicated by the second value.

* * * * *